United States Patent [19]

Penven et al.

[11] Patent Number: 5,070,214

[45] Date of Patent: Dec. 3, 1991

[54] ORGANIC MATERIAL WITH EXTREMELY NARROW ELECTRON SPIN RESONANCE LINE AND GAUSSMETER PROBE OR MAGNETOMETER USING THIS MATERIAL

[75] Inventors: Paul Penven, Orsay; Philippe Michel, Paris; Denis Jerome, Jouy en Josas; Alexandre Moradpour, Paris, all of France

[73] Assignee: Thomson CSF, Puteaux, France

[21] Appl. No.: 358,141

[22] Filed: May 30, 1989

[30] Foreign Application Priority Data

May 31, 1988 [FR] France .................................. 88 07214

[51] Int. Cl.$^5$ ................................................ C07F 9/00
[52] U.S. Cl. ........................................ 556/64; 556/13; 568/9; 568/16; 324/244; 324/262; 324/263; 570/129
[58] Field of Search ...................... 324/244, 262, 263; 556/64, 13; 568/9, 16; 570/129

[56] References Cited

U.S. PATENT DOCUMENTS

| | | | |
|---|---|---|---|
| 3,981,897 | 9/1976 | Crivello | 556/64 |
| 4,219,654 | 8/1980 | Crivello | 568/16 X |
| 4,522,754 | 6/1985 | Hilti et al. | 570/129 X |

OTHER PUBLICATIONS

Journal de Physique, Colloque C3, supplement au No. 6, vol. 44, Jun. 1983, pp. C3-1235-C3-1238, R. Lapouyade et al.
Applied Physics A, Solids and Surfaces, vol. A30, No. 4, Apr. 1983, pp. 227-231, E. Dormann, et al.

*Primary Examiner*—Jose G. Dees
*Assistant Examiner*—Porfirio Nazario Gonzalez
*Attorney, Agent, or Firm*—Oblon, Spivak, McClelland, Maier & Neustadt

[57] ABSTRACT

Disclosed is an organic material with a very narrow electronic spin resonance (ESR) line. This material is formed by a 1, 2, 7, 8-tetrahydrocyclopentataperylene salt which may have, advantageously, undergone a heat treatment. The material can be applied to the fabrication of probes for gaussmeters and magnetometers.

8 Claims, 2 Drawing Sheets

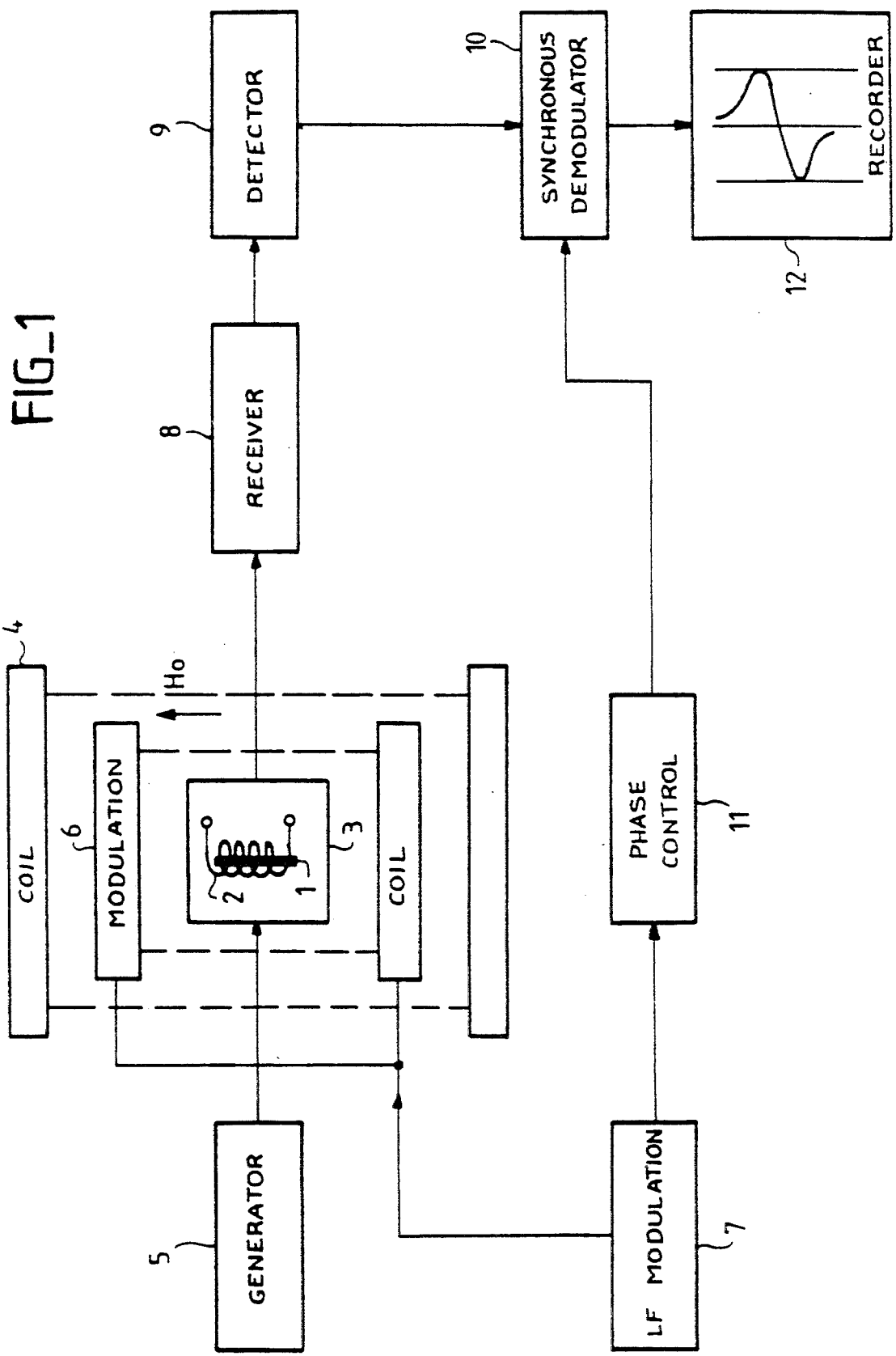

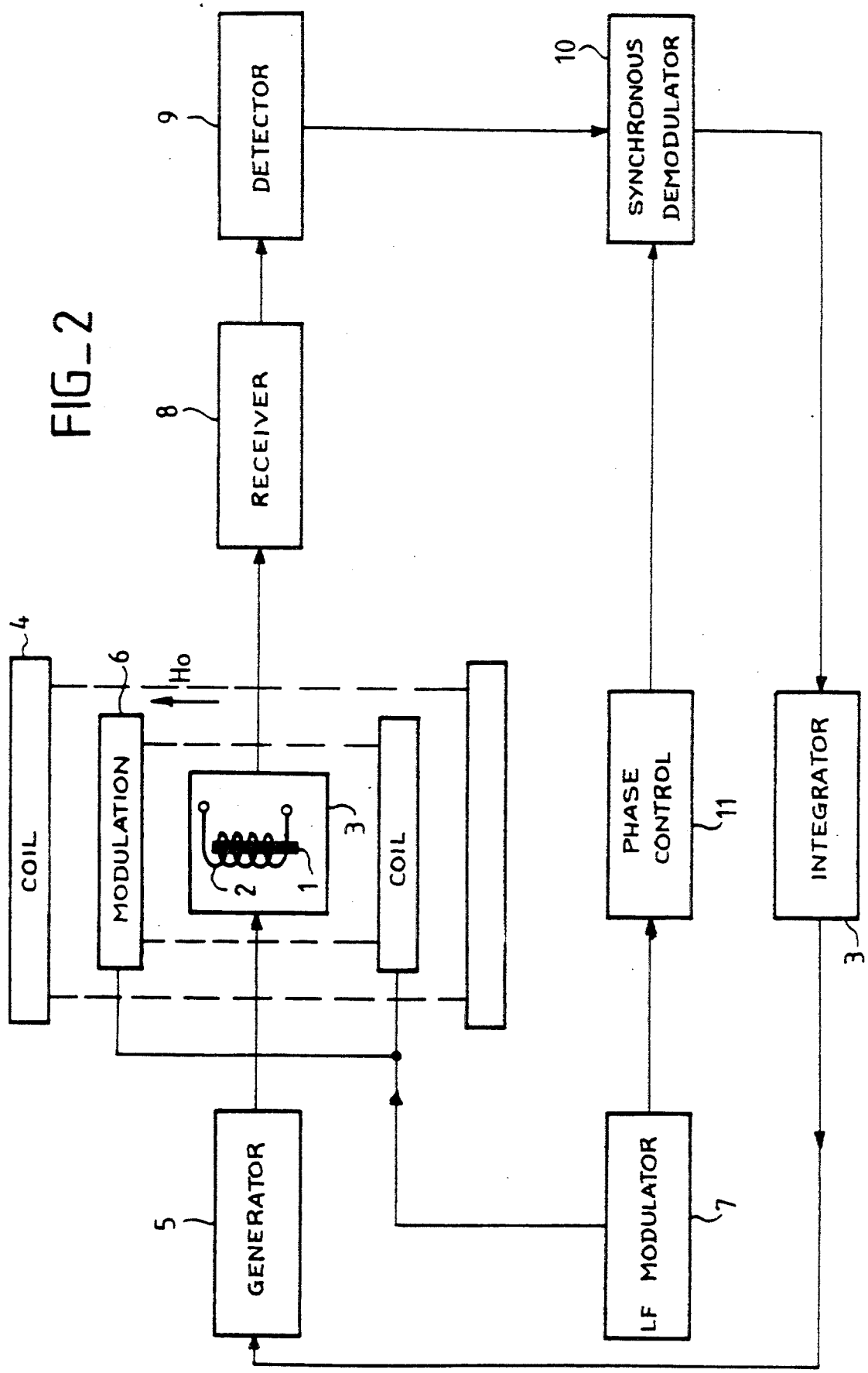
FIG_2

5,070,214

ORGANIC MATERIAL WITH EXTREMELY NARROW ELECTRON SPIN RESONANCE LINE AND GAUSSMETER PROBE OR MAGNETOMETER USING THIS MATERIAL

BACKGROUND OF THE INVENTION

1. Field of the Invention

The present invention concerns an organic material with an extremely narrow electron spin resonance (ESR) line and its application to the making of gaussmeters or magnetometers.

2. Description of the Prior Art

To enable the making, notably, of magnetic anomaly probes, working in the earth's magnetic field, various research centers have undertaken studies of certain organic materials with extremely narrow ESR lines. The desired ESR line widths are smaller than 20 mG.

Radical-cation salts derived from certain condensed aromatic hydrocarbons such as fluoranthene (FA) and perylene (PY) have remarkable electron spin resonance (ESR) properties. For $(FA)_2 PF_6$ for example, a remarkably narrow ESR signal at ambient temperature has been observed.

This material has an absorption derivative peak-peak line width of only 10 milligauss. The concerned absorption signal is therefore practically 100 times narrower than the ESR signal of the diphenylpicrylhydracyl radical (DPPH) commonly used as an ESR field standard. However, while the absence of heteroatoms in these materials may be favorable to the narrowness of the ESR line widths, it is, on the other hand, a factor that causes a certain degree of thermal instability. Thus, for example, salts prepared from naphthalene are stable only below $-40°$ C., while the corresponding ESR line width is the narrowest (4 milligauss) for this entire series of materials.

The remarkable narrowness of these electron spin resonance lines should enable the use of these materials to make very highly sensitive magnetometers provided that their thermal stability in time, which is at very insufficient at present, is notably improved.

With respect to substituted perylenes, only a small number of alkylperylenes has been synthesized. These are the three monomethyl regiosoisomers, 1-(n butyl)- perylene, 1- and 2- ethylperylene, 2.8-, 3.9- and 2.11- dimethylperylenes. The alkylperylenes with higher substitution levels are rare, and only 1, 2, 7, 8-tetrahydrocyclopenta [cd:1m] perylene has been synthesized with low efficiency (N. TANAKA, T. KASAI, *Bulletin of the Chemical Society of Japan*, 1981, Vol. 54, p. 3026).

The article "Radical-cation salts of substituted perylenes" by R. LAPOUYADE, J. P. MORAND, D. CHASSEAU, C. HAUW and P. DELHAES in the *Journal De Physique* (Conference C3, supplement to No. 6, Vol. 44, June 1983 pages C3-1235 to C3-1238) concerns a radical-cation salt of 1, 2, 7, 8-tetrahydrocyclopenta {cd:1m}.

This substitute perylene may be more simply called CPP. The stoichiometry of the salt in question is $(CPP)_2 + PF_6-, CH_2Cl_2$.

According to the authors of this article, this salt has an absorption derivative peak-peak line width of the order of 80 milligauss.

In order to obtain a material which has good thermal stability at ambient temperature while, at the same time, having an ESR line width smaller than 20 mG and high stability in air, the applicant has done a great deal of work on different salts of organic materials and, especially, on substituted perylenes. The applicant has taken up and has extended studres made on, among other materials, 1, 2, 7, 8- tetrahydrocyclopenta {cd:1m} perylene or CPP. The conclusions of this research have proved to be astonishing. For, the following CPP salt, $(CPP)_2 + PF_6-, CH_2Cl_2$, which had been stated, in the above-quoted article "Radical-cation Salts of Substituted Perylenes" by R. LAPOUYADE, J.P. MORAND, D. CHASSEAU, C. HAUW and P. DELHAES in JOURNAL DE PHYSIQUE (Conference C3, supplement to No. 6, Vol. 44, June 1983, pages C3-1235 to C-1238), as having an ESR line width of 80 mG, has in fact proved to have ESR line width of 16 mG.

Owing to the declared line width (80 mG) which was defined only to characterize the material, its use to make magnetic field probes for gaussmeters or magnetometers could not be contemplated.

The applicant has pursued research on the material in question and has found that an appropriate heat treatment has, contrary to all expectations, highly beneficial consequences for the ESR line width and, hence, for the possibilities of use of this material.

SUMMARY OF THE INVENTION

An object of the invention, therefore, is an organic material with a very narrow electronic spin resonance line which can be used in gaussmeter or magnetometer probes, said material being formed by a 1, 2, 7 8-tetrahydrocyclopentataperylene salt.

Another object of the invention is a gaussmeter or magnetometer probe using the above organic material.

BRIEF DESCRIPTION OF THE DRAWINGS

The invention will be better understood and its other advantages will appear from the following description, given as a non-restrictive example, accompanied by the appended drawings, of which:

FIG. 1 gives a schematic view of a first device to measure the ESR line width;

FIG. 2 gives a schematic view of a second device to measure the ESR line width.

DESCRIPTION OF PREFERRED EMBODIMENTS

Measurements made by the applicant on 1, 2, 7, 8-tetrahydrocyclopentaperylene or CPP, in the form of $(CPP)_2 + PF_6-, CH_2Cl_2$ salt, have shown that the ESR line width is 16 milligauss. Furthermore, when this salt undergoes an appropriate heat treatment (for example it is taken to a temperature of 60° C. for about 2 hours), the ESR line width is 13 milligauss after return to ambient temperature. The material obtained is stable in air and its ESR line is not degraded in time up to a temperature of 80° C.:

FIG. 1 gives a schematic view of the experimental device to measure the ESR line width of a material of the type proposed by the invention.

The sample 1, for which it is sought to measure the ESR line width, is placed within the coil 2 of a circuit 3 including, in addition to this coil, a capacitor C. The passage to the resonant frequency $\omega_o$ of the circuit 3, obtained by sweeping the magnetic field $H_o$ of the coil 4, results in an additional charge of the generator 5 or in a modification of the quality factor of its resonant circuit. It is then shown that the dissipated power is proportionate to the product:

$$\omega_o \times H_o^2 \times \chi'' \times V \quad (1)$$

where $\chi$ is the imaginary part of the magnetic susceptibility of the analyzed material and V is the volume of the sample.

For more details, reference may be profitably made to A. ABRAGAM, *Les Principes du Magnétism Nucléaire* (Principles of Nuclear Magnétism), Bibliotheque des Sciences et Techniques Nucleaires, PUF 1961, p. 86.

The use of a magnetic field modulation (by means of the coil 6) or a frequency modulation, and of a synchronous detector enable an improvement in the sensitivity of the measuring device. According to the diagram of FIG. 1, the device further has a low frequency (LF) modulation device 7 acting on the modulation coil 6. The output signal of the circuit 3 is received by the receiver 8 which delivers a signal to the detector 9. The output signal of the detector is received by the synchronous demodulator 10 which, depending on a phase control signal coming from the phase control device 11 of the reference signal, gives the recorder 12 a signal enabling the display of the field derivative of the absorption signal.

It is possible to use the different experimental devices proposed by A. Abragam in the above-mentioned work: Q-meter method, bridge method, cross-wound coils method, marginal oscillator, transient methods of detection, etc.

Under the following experimental conditions:
magnetic field $H_o = 8$ gauss,
passband = 0.3 Hz,
mass of the sample = 4 mg,
the signal-to-noise ratio obtained is 100.

For a line of 13 milligauss width, the precision in the measurement of the resonance field is about 0.13 milligauss.

By way of example, it is thus possible to make fast measurements (within three seconds) of the following, with a precision close to 0.1 milligauss, using the relationship (1):

a magnetic field of 8 gauss with 4 mg. of CPP salt having undergone heat treatment: this represents the volume of a cylinder with a diameter of 1 mm. and a length of 5 mm;

a magnetic field of 80 gauss with 0.04 mg. of the same CPP salt: this represents a monocrystal of material;

a magnetic field of 0.8 gauss with 400 mg. of the same CPP salt: this represents the volume of a cylinder with a diameter of 7 mm. and a length of 1 cm.

The magnetic field variations can be measured by using the ESR signal to automatically lock the frequency so that the resonance condition will be achieved at all times. The measurement of the variation in frequency directly gives the variation in magnetic field. The device shown schematically in FIG. 2 has enabled magnitudes computed for 8 gauss and 0.8 gauss to be obtained. In FIG. 2, the same elements as those of FIG. 1 bear the same references. An integrator 13 has been added. This integrator 13 receives the output signal from the synchronous demodulator 10 and will drive the frequency of the generator 5 as a function of this signal.

With the device of FIG. 2, it is possible to draw up a map of a magnetic field created by a coil working at 50 gauss and beyond, in using a probe formed by one or more monocrystals of the CPP salt.

Materials other than CPP salts can be used to make magnetic field probes for gaussmeters. However, their number is very limited, for they should have very narrow ESR line widths (narrower than 20 milligauss) to enable measurement that is sufficiently fast and precise with a small-sized probe. In effect, the sensitivity of the gaussmeter is proportionate to the slope of the ESR line in the vicinity of the magnetic resonance field. It is therefore proportionate to the peak-peak amplitude of the ESR line and inversely proportionate to the line width. Now, for materials having a susceptibility $\chi$ of the same magnitude, as is the case with radical-cation salts, the peak-peak amplitude of the ESR signal is inversely proportional to the square of the line width. Consequently, the sensitivity of the gaussmeter is inversely proportionate to the cube of the ESR line width of the material.

By way of example, a line width of 80 milligauss causes a loss in sensitivity by a factor of 200 with respect to a material with a line width of 13 milligauss. This loss in sensitivity cannot be compensated for, if it is desired neither to degrade the precision of the measurement nor to increase the time required for it, except by a considerable increase in the quantity of the sample, hence in the size of the probe, thus making the abovementioned applications impossible.

According to the prior art, fluoranthene radical-cation salts have been proposed to make magnetic field probes for gaussmeters, for example in the article by G. DORMANN, G. SACHS, W. STOCKLEIN, B. BAIL, M. SCHWOERER, "Gaussmeter Application of An Organic Conductor" in *Applied Physics A*, vol. 30, pp. 227-231, 1983. However, the thermal instability of the ESR line at ambient temperature and its even greater instability at higher temperatures prevents any industrial-scale use of this gaussmeter. No other thermally stable material has a line narrower than 15 milligauss, enabling its use as a magnetic field probe.

According to the invention, the use of 1, 2, 7, 8-tetrahydrocyclopentaperylene, stable up to 80° C., to replace fluoranthene salts as a magnetic field probe for gaussmeters, gives comparable performance levels through its narrow ESR line and, owing to its thermal stability, enables industrial-scale use of instruments of this type.

According to the invention, salts other than CPP hexafluorophosphate can be used, for example hexafluoroarseniate. Their preparation entails no particular problems for those skilled in the art.

The heat treatment that the material according to the invention is obliged to undergo has the consequence of reducing the ESR line width. This was totally unforeseeable to those skilled in the art because, in any case, the organic materials used in gaussmeter probes have their properties degraded when the temperature increases and after return to ambient temperature. The material according to the invention is the only known instance, in the field considered, where the raising of temperature has beneficial consequences for the ESR properties.

It should be further noted that this heat treatment is very easy to apply. In the above-mentioned example, it was by taking the CPP to a temperature of 60° C. for two hours that a product with exceptional ESR qualities was obtained. The temperature of the heat treatment and its duration may be modified within certain proportions, the values indicated above being mean values.

What is claimed is:

1. Gaussmeter or magnetometer probe comprising an organic material with a very narrow electronic spin resonance, said material being formed by a 1,2,7,8-tetrahydrocyclopentaperylene salt.

2. Gaussmeter or magnetometer probe, according to claim 1, wherein said salt is a hexafluorophosphate.

3. Gaussmeter or magnetometer probe, according to claim 1, wherein said salt is a hexafluoroarseniate.

4. Gaussmeter or magnetometer probe, according to claim 1, wherein said salt has undergone a heat treatment, the consequence of which is to reduce its electron spin resonance line width.

5. Gaussmeter or magnetometer probe according to claim 4, wherein the heat treatment consists in taking said salt to a temperature of 60° C. for two hours.

6. A 1,2,7,8-tetrahydrocyclopentaperylene salt wherein said salt is a hexafluoroarseniate and has a very narrow electronic spin resonance line.

7. A 1,2,7,8-tetrahydrocyclopentaperylene salt which has a very narrow electronic spin resonance line wherein said salt has undergone a heat treatment to reduce its electron spin resonance line width.

8. A salt according to claim 7, wherein said heat treatment comprises taking said salt to a temperature of 60° C. for two hours.

* * * * *